(12) United States Patent
Xi et al.

(10) Patent No.: US 10,513,608 B2
(45) Date of Patent: Dec. 24, 2019

(54) PROCESS FOR PREPARING RESIN COMPOSITION COMPRISING BENZOXAZINE, PREPREG AND LAMINATE PREPARED THEREFROM

(71) Applicant: SHENGYI TECHNOLOGY CO., LTD., Guangdong (CN)

(72) Inventors: Long Xi, Guangdong (CN); Jiang Li, Guangdong (CN); Yongjing Xu, Guangdong (CN)

(73) Assignee: SHENGYI TECHNOLOGY CO., LTD. (CN)

( * ) Notice: Subject to any disclaimer, the term of this patent is extended or adjusted under 35 U.S.C. 154(b) by 133 days.

(21) Appl. No.: 15/736,887

(22) PCT Filed: Mar. 29, 2017

(86) PCT No.: PCT/CN2017/078496
§ 371 (c)(1),
(2) Date: Dec. 15, 2017

(87) PCT Pub. No.: WO2018/120471
PCT Pub. Date: Jul. 5, 2018

(65) Prior Publication Data
US 2018/0362762 A1    Dec. 20, 2018

(30) Foreign Application Priority Data

Dec. 30, 2016  (CN) .......................... 2016 1 1262943

(51) Int. Cl.
| | | |
|---|---|---|
| *C08L 79/06* | (2006.01) |
| *C08J 5/24* | (2006.01) |
| *H05K 1/03* | (2006.01) |
| *H05K 3/46* | (2006.01) |
| *C08L 63/00* | (2006.01) |

(52) U.S. Cl.
CPC .................. *C08L 79/06* (2013.01); *C08J 5/24* (2013.01); *C08L 63/00* (2013.01); *H05K 1/0373* (2013.01); *H05K 3/4626* (2013.01); *C08J 2363/00* (2013.01); *C08J 2379/06* (2013.01); *C08J 2463/00* (2013.01); *C08J 2479/06* (2013.01); *C08L 2201/02* (2013.01); *C08L 2203/20* (2013.01); *C08L 2205/025* (2013.01); *C08L 2205/03* (2013.01); *C08L 2205/035* (2013.01); *H05K 2201/012* (2013.01); *H05K 2203/068* (2013.01)

(58) Field of Classification Search
CPC .. C08L 79/06; C08L 2201/02; C08L 2203/20; C08L 2205/025; C08L 2205/03; C08L 2205/035; C08L 63/00; C08L /; H05K 2203/068; H05K 1/0373; H05K 3/4626; H05K 2201/012; C08J 5/24; C08J 2379/06; C08J 2363/00; C08J 2463/00; C08J 2479/06
USPC ........................................................ 524/127
See application file for complete search history.

(56) References Cited

U.S. PATENT DOCUMENTS

| | | |
|---|---|---|
| 8,173,040 B2 | 5/2012 | Kim et al. |
| 9,005,761 B2 | 4/2015 | Lin et al. |
| 2015/0307703 A1* | 10/2015 | He ........................ B32B 15/16 428/195.1 |

FOREIGN PATENT DOCUMENTS

| | | | |
|---|---|---|---|
| CN | 102850545 | | 1/2013 |
| CN | 105482452 | | 4/2016 |
| CN | 105542394 | * | 5/2016 |
| CN | 105542394 A | | 5/2016 |
| CN | 105968321 A | | 9/2016 |
| JP | 05310889 | * | 11/1993 |
| JP | H05310889 | | 11/1993 |
| JP | 2005272672 | | 10/2005 |
| KR | 20130125383 A | | 11/2013 |

OTHER PUBLICATIONS

Translation of abstract of CN105542394, May 4, 2016. (Year: 2016).*
Translation of JP05310889, Nov. 22, 1993. (Year: 1993).*
Patent Cooperation Treaty (PCT), International Search Report and Written Opinion for Application PCT/CN2017/078496 filed Mar. 29, 2017, dated Aug. 17, 2017, International Searching Authority, CN.
Zeng, Ming et al., "Research Progress of Catalytic and Curing Behavior of Benzoxazines." Market Symposium. pp. 207-2018.

* cited by examiner

*Primary Examiner* — Hui H Chin
(74) *Attorney, Agent, or Firm* — McDonald Hopkins LLC

(57) ABSTRACT

The present invention relates to a process for preparing a resin composition comprising benzoxazine, a prepreg and a laminate prepared therefrom. Said resin composition comprising benzoxazine is prepared by adding an acidic filler into the resin composition comprising benzoxazine, wherein said resin composition comprising benzoxazine comprises a benzoxazine resin, an epoxy resin A1 having an epoxy equivalent of 150-450, and an epoxy resin A2 having an epoxy equivalent of 451-1000. By adding an acidic filler into the resin composition, the present invention promotes the polymerization of benzoxazine and epoxy resins, and decreases the curing temperature needed for the polymerization of benzoxazine and epoxy resins. The laminates prepared from the resin composition added with an acidic filler have a high anti-stripping stability, a high glass transition temperature, a low water absorption, a high heat resistance, a high bending strength and a better processability, and achieves a low coefficient of thermal expansion.

19 Claims, No Drawings

PROCESS FOR PREPARING RESIN COMPOSITION COMPRISING BENZOXAZINE, PREPREG AND LAMINATE PREPARED THEREFROM

CROSS-REFERENCE TO RELATED APPLICATION

This application is a 35 U.S.C. 371 national stage filing of PCT Application No. PCT/CN2017/078496 filed on Mar. 29, 2017, which claims priority to Chinese Patent Application No. 201611262943.7 filed on Dec. 30, 2016, each of which are incorporated herein in their entirety by reference.

TECHNICAL FIELD

The present invention relates to the field of copper clad laminates, especially a process for preparing a resin composition comprising benzoxazine, a prepreg and a laminate prepared therefrom.

BACKGROUND ART

In the electronic material industry, phosphorus-containing resins or flame retardants are usually applied to achieve bromine-free flame retardancy, and combined with nitrogen-containing resins or flame retardants to achieve synergistic phosphorous-nitrogen flame retardancy. Nitrogen element in benzoxazine resin, combined with phosphorus element, can achieve the V-0 level of UL 94 via a lower phosphorus content. In combination with a low curing shrinkage and a better moisture and heat resistance, it is widely used. Due to the structural feature of benzoxazine resin, the ring-opening polymerization of benzoxazine needs a higher temperature, which brings about difficulties to the industrialized mass production and becomes an application difficulty.

Many studies have been made on the aforesaid difficulty by research fellows in the industry, and their work is primarily concentrated on the effects of amine curing agents, phenolic resins, organic acids and the like on the reaction of benzoxazine and the mechanism discussion. For the industry of printed circuit boards (copper clad laminates), it is difficult to convert and apply these research results. The reasons lie in that amine curing agents have a worse heat resistance, and the semi-finished products have a short storage period; although phenolic resins have a better heat resistance, it has worse dielectric properties and a lower peeling strength; organic acids have an obvious ring-opening effect on benzoxazine, however, due to the oven temperature of up to more than 200° C., acids having a low boiling point will evaporate completely during the production of copper clad laminates, and cannot catalyze the ring-opening and polymerization of benzoxazine during lamination process; organic acids having a high boiling point will remain in the resin composition, which increases the risk of delamination and popcorn in PCB due to heat during the production. Thus there are always difficulties for the application of benzoxazine resins.

DISCLOSURE OF THE INVENTION

On such a basis, the object of the present invention is to provide a process for preparing a resin composition comprising benzoxazine, a prepreg and a laminate prepared therefrom. By adding an acidic filler into the resin composition comprising benzoxazine, the present invention greatly promotes the polymerization of benzoxazine and epoxy resin, and decreases the curing temperature needed for the polymerization of benzoxazine and epoxy resin. The laminates prepared from the composition added with an acidic filler have a high anti-stripping stability, a high glass transition temperature, a low water absorption, a high heat resistance, a high bending strength and a better processability, and can achieve a low coefficient of thermal expansion.

The inventors made repeated and thorough studies in order to achieve the aforesaid object, and found that the aforesaid object could be achieved by suitably mixing an acidic filler with a resin composition comprising benzoxazine for the preparation of the resin composition.

In order to achieve the aforesaid object, the present invention discloses the following technical solution, a process for preparing a resin composition comprising benzoxazine, characterized in adding an acidic filler having a pH of 2-6 into the resin composition comprising benzoxazine, wherein said resin composition comprising benzoxazine comprises a benzoxazine resin and epoxy resins comprising an epoxy resin A1 having an epoxy equivalent of 150-450, and an epoxy resin A2 having an epoxy equivalent of 451-1000.

The present invention discloses that the addition of acidic filler into the resin composition comprising benzoxazine can catalyze the ring-opening polymerization of benzoxazine and epoxy resins, and promote the self-crosslinking polymerization of benzoxazine, which greatly reduces the temperature required for the polymerization of benzoxazine and epoxy resins. In addition, the melting point of acidic filler may be as high as 1000° C. or more. Thus, the acidic filler neither evaporates during the production of copper clad laminates, nor decomposes during the PCB processing, which solves the weakness of organic acids and common inorganic acids in resins. Furthermore, the acidic filler in the resin composition can also reduce the CTE (coefficient of thermal expansion) of the products, and will be beneficial to the reliability of the products if it remains in the resin composition.

By combining epoxy resins having different structures and epoxy equivalents together, the present invention improves the worse machinability of the resin composition, while ensuring that the resin composition has a higher glass transition temperature, a better mechanical performance and a lower water absorption.

In the present invention, said acidic filler has a pH of 2-6, e.g. 2, 2.5, 3, 3.5, 4, 5 or 6, and any specific point values between said values above. Due to space limitations and for concise consideration, the present invention will not exhaustively list any specific point values included in the range.

In the present invention, the acidic filler is characterized in formulating the filler and deionized water in a mass ratio of 1:9 into an aqueous solution, measuring and determining that the filler has a pH of 2-6.

Preferably, the acidic filler has a pH of 4-6.

In the present invention, said acidic filler is anyone selected from the group consisting of silica powder, quartz powder, mica powder, clay, calcium oxalate and carbon black, or a mixture of at least two selected therefrom. The typical but non-limitative mixture is selected from the group consisting of the mixtures of silica powder and quartz powder, clay and calcium oxalate, and carbon black and mica powder.

In the present invention, said acidic filler has a particle size of 50 nm-50 μm, e.g. 50 nm, 60 nm, 70 nm, 80 nm, 90 nm, 100 nm, 300 nm, 500 nm, 800 nm, 5 μm, 10 μm, 30 μm, 40 μm, 45 μm or 50 μm, and any specific point values between said values above. Due to space limitations and for concise consideration, the present invention will not exhaustively list any specific point values included in the range.

The present invention does not make any specific definitions to the physical form of said acidic filler, and it may be sheet-shaped, rod-shaped, spherical, hollow spherical, granular, fibrous or plate-shaped. Selectively, said acidic filler is treated with a silane coupling agent.

According to the present invention, said acidic filler is added in an amount of 0.05-100 parts by weight on the basis of 100 parts by weight of organic solids in the resin composition comprising benzoxazine, e.g. 0.05, 0.1, 1, 10, 20, 30, 40, 55, 60, 65, 70, 80, 90 or 100 parts by weight, and any specific point values between said values above. Due to space limitations and for concise consideration, the present invention will not exhaustively list any specific point values included in the range.

Preferably, said acidic filler is added in an amount of 5-60 parts by weight, on the basis of 100 parts by weight of organic solids in the resin composition comprising benzoxazine.

In the present invention, the acidic filler is preferably added in an amount of 5-60 parts by weight. Upon research, the inventors found that, if the filler is added in an amount of higher than 60 parts by weight, the resin composition as a whole has a stronger acidity; the ring-opening polymerization of benzoxazine-epoxy system obviously accelerates, thus narrowing the processing window of the resin composition. If the filler is added in an amount of lower than 5 parts by weight, the resin composition as a whole has a weaker acidity; the catalytic effect on the benzoxazine-epoxy system is not obvious.

In the present invention, the resin composition comprising benzoxazine comprises the following components, based on 100 parts by weight of organic solids,
  (A) from 5 to 80 parts by weight of epoxy resins,
  (B) from 10 to 80 parts by weight of a benzoxazine resin, and
  (C) from 1 to 30 parts by weight of a flame retardant,
  wherein epoxy resins A1 and A2 in the epoxy resins have a weight ratio of 10:1-1:10, e.g. 10:1, 10:2, 10:3, 10:4, 10:5, 10:6, 10:7, 10:8, 10:9, 1:1, 1:2, 1:3, 1:4, 1:5, 1:6, 1:7, 1:8, 1:9 or 1:10, and any specific point values between said values above. Due to space limitations and for concise consideration, the present invention will not exhaustively list any specific point values included in the range, the ratio is preferably 4:1-1:4.

In the present invention, said epoxy resins are added in an amount of from 5 to 80 parts by weight, e.g. 5, 7, 10, 12, 15, 18, 20, 25, 30, 45, 50, 60, 70 or 80 parts by weight, and any specific point values between said values above. Due to space limitations and for concise consideration, the present invention will not exhaustively list any specific point values included in the range, and said epoxy resins are preferably in an amount of 20 to 80 parts by weight.

According to the present invention, said epoxy resins comprise an epoxy resin A1 having an epoxy equivalent of 150-450, and an epoxy resin A2 having an epoxy equivalent of 451-1000.

In the present invention, the combination of epoxy resins having different epoxy equivalents not only ensures that the resin composition has a higher glass transition temperature, a better mechanical performance and a lower water absorption, but also improves the worse machinability of the resin composition.

In the present invention, said epoxy resin A1 is anyone selected from the group consisting of biphenyl epoxy resin, dicyclopentadiene epoxy resin, phenolic type epoxy resin, naphthalene-containing epoxy resin and anthracene-containing epoxy resin, or a mixture of at least two selected therefrom, and has an epoxy equivalent of 150-450. The typical but non-limitative mixture is selected from the group consisting of the mixtures of biphenyl epoxy resin and dicyclopentadiene epoxy resin, dicyclopentadiene epoxy resin and naphthalene-containing epoxy resin, naphthalene-containing epoxy resin and anthracene-containing epoxy resin. The epoxy equivalent thereof is selected from the group consisting of, e.g. 150, 180, 192, 200, 210, 250, 315, 380, 400 or 450, and any specific point values between said values above. Due to space limitations and for length and concise consideration, the present invention will not exhaustively list any specific point values included in the range.

In the present invention, said epoxy resin A2 is anyone selected from the group consisting of bisphenol A epoxy resin, bisphenol F epoxy resin, carboxylated nitrile-butadiene rubber modified epoxy resin and epoxy resin containing oxazolidinone ring, or a mixture of at least two selected therefrom, and has an epoxy equivalent of 451-1000. The typical but non-limitative mixture is selected from the group consisting of the mixtures of bisphenol A epoxy resin and carboxylated nitrile-butadiene rubber modified epoxy resin, carboxylated nitrile-butadiene rubber modified epoxy resin and epoxy resin containing oxazolidinone ring. The epoxy equivalent thereof is selected from the group consisting of, e.g. 451, 455, 480, 492, 500, 610, 720, 810, 861, 900 or 1000, and any specific point values between said values above. Due to space limitations and for concise consideration, the present invention will not exhaustively list any specific point values included in the range.

The selection of epoxy resins, the guidance and control of acidic filler to benzoxazine ring-opening polymerization will produce synergistic effects with each other, which is conducive to realizing more stable peeling strength and increasing the reliability of the resin composition.

In the present invention, said benzoxazine resin is added in an amount of from 10 to 80 parts by weight, e.g. 10, 12, 15, 18, 20, 25, 30, 45, 50, 60, 70 or 80 pars by weight, and any specific point values between said values above. Due to space limitations and for concise consideration, the present invention will not exhaustively list any specific point values included in the range, and said benzoxazine resin is preferably in an amount of 30 to 65 parts by weight.

In the present invention, said benzoxazine resin is anyone selected from the group consisting of bisphenol A type benzoxazine resin, dicyclopentadiene benzoxazine resin, bisphenol F type benzoxazine resin, phenolphthalein benzoxazine resin and MDA type benzoxazine resin, or a mixture of at least two selected therefrom. The typical but non-limitative mixture is selected from the group consisting of the mixtures of bisphenol A type benzoxazine resin and dicyclopentadiene benzoxazine resin, dicyclopentadiene benzoxazine resin and bisphenol F type benzoxazine resin, bisphenol F type benzoxazine resin and phenolphthalein benzoxazine resin.

Said bisphenol A type benzoxazine resin monomer, bisphenol F type benzoxazine resin monomer and phenolphthalein benzoxazine resin monomer have the following structure as shown in Formula (a)

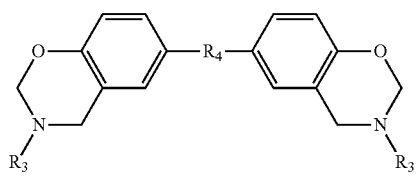

Formula (α)

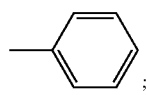

wherein $R_3$ is $R_4$ is anyone selected from the group consisting of

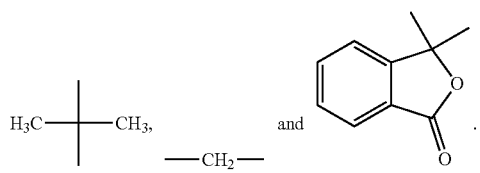

When $R_4$ is

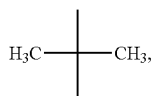

Formula (α) represents bisphenol A type benzoxazine resin monomer; when $R_4$ is —$CH_2$—, Formula (α) represents bisphenol F type benzoxazine resin monomer; when $R_4$ is

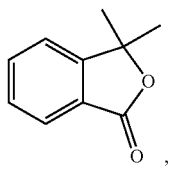

Formula (α) represents phenolphthalein benzoxazine resin monomer.

Said MDA type benzoxazine resin, also known as (4,4'-diaminodiphenylmethane) type benzoxazine resin, has the following structure as shown in Formula (13), Formula (β)

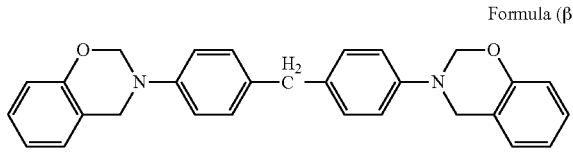

Said dicyclopentadiene benzoxazine resin monomer has the following structure as shown in Formula (γ)

Formula (γ)

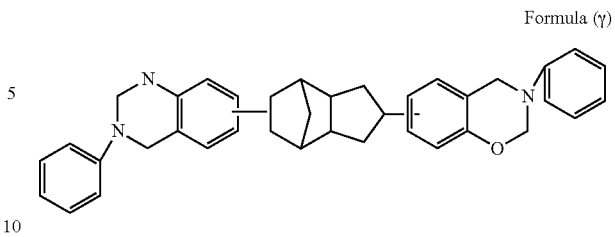

According to the present invention, said flame retardant is added in an amount of 1-30 parts by weight, e.g. 1, 2, 5, 8, 10, 15, 20, 25, 28 or 30 parts by weight, and any specific point values between said values above. Due to space limitations and for concise consideration, the present invention will not exhaustively list any specific point values included in the range, and said flame retardant is preferably in an amount of 3-20 parts by weight.

In the present invention, said flame retardant is anyone selected from the group consisting of resorcinol-bis(diphenyl phosphate), bisphenol A-bis(diphenyl phosphate), resorcinol-bis(2,6-dimethylphenyl phosphate), dimethyl methyl phosphonate and phosphazene compounds, or a mixture of at least two selected therefrom. The typical but non-limitative mixture is selected from the group consisting of the mixtures of resorcinol-bis(diphenyl phosphate) and bisphenol A-bis(diphenyl phosphate), bisphenol A-bis(diphenyl phosphate) and resorcinol-bis(2,6-dimethylphenyl phosphate), resorcinol-bis(2,6-dimethylphenyl phosphate) and dimethyl methyl phosphonate, and dimethyl methyl phosphonate and phosphazene compounds.

In the present invention, the resin composition comprising benzoxazine further comprises an epoxy resin having an epoxy equivalent of greater than 1000, and the specific types thereof are not specifically defined herein.

According to the present invention, the resin composition comprising benzoxazine may further comprise a non-acidic filler.

Preferably, said non-acidic filler is anyone selected from the group consisting of calcium carbonate, calcium sulfate, alumina, barium sulfate, ceramic powder, talc powder and hydrotalcite, or a mixture of at least two selected therefrom. The typical but non-limitative mixture is selected from the group consisting of the mixtures of calcium carbonate and calcium sulfate, alumina and barium sulfate, ceramic powder and hydrotalcite.

Preferably, said non-acidic filler is added in an amount of 0-100 parts by weight on the basis of 100 parts by weight or organic solids, e.g. 1, 5, 12, 15, 24, 35, 48, 56, 78, 89 or 100 parts by weight, as well as any specific point values between said values. Due to space limitations and for concise consideration, the present invention will not exhaustively list any specific point values included in the range.

According to the present invention, said resin composition comprising benzoxazine further comprises (D) a curing accelerator. Based on 100 parts by weight of organic solids in the resin composition comprising benzoxazine, said curing accelerator is added in an amount of from 0.1 to 1 part by weight, e.g. 0.1, 0.2, 0.3, 0.4, 0.5, 0.6, 0.7, 0.8, 0.9 or 1 part by weight, as well as any specific point values between said values. Due to space limitations and for concise consideration, the present invention will not exhaustively list any specific point values included in the range.

In the present invention, said curing accelerator is anyone selected from the group consisting of imidazole accelerators and their derivatives, pyridine accelerators and Lewis acid accelerators, or a mixture of at least two selected therefrom. The typical but non-limitative mixture is selected from the group consisting of the mixtures of imidazole accelerators and pyridine accelerators, pyridine accelerators and Lewis acid accelerators, imidazole accelerators and Lewis acid accelerators.

Preferably, said imidazole accelerator is anyone selected from the group consisting of 2-methylimidazole, 2-ethyl-4-methylimidazole, 2-phenylimidazole, and 2-undecylimidazole, or a mixture of at least two selected therefrom The curing accelerator is beneficial for the curing reaction of epoxy resin, benzoxazine resin and curing agent, so as to form homogeneous three-dimensional network molecular structure, to achieve better physical properties, to promote the decrease of group concentrations of hydroxyl (—OH) and epoxy groups, to help the resin composition reach better dielectric properties, to decrease the dielectric constant and dielectric loss.

The second object of the present invention lies in providing a resin composition comprising benzoxazine, comprising an epoxy resin, a benzoxazine resin and an acidic filler, wherein the acidic filler has a pH of 2-6; said epoxy resin comprises an epoxy resin A1 having an epoxy equivalent of 150-450, and an epoxy resin A2 having an epoxy equivalent of 451-1000.

Those skilled in the art know that, besides epoxy resin, benzoxazine resin and acidic filler, the resin composition comprising benzoxazine further optionally comprises the components such as the flame retardant, epoxy resin having an epoxy equivalent of greater than 1000, non-acidic filler and curing accelerator in the first aspect of the present invention. Moreover, each component in the resin composition and contents thereof may illustratively refer to the ranges stated in the first aspect of the present invention.

The term "comprising/comprise(s)" in the present invention means that, in addition to said components, there may also include other components which impart different characteristics to the resin composition. In addition to this, the term "comprising/comprise(s)" in the present invention may be replaced by a closed-form "is/are" or "consisting/consist(s) of".

For example, the resin composition comprising benzoxazine may also comprise various additives, such as antioxidant, thermal stabilizer, anti-static agent, ultra-violet absorber, pigment, colorant, lubricant and the like. These additives may be used alone or in combination of two or more.

As for the preparation steps of the resin composition comprising benzoxazine not further defined in the present invention, those skilled in the art may make selection by reference to the current processes for preparing resin compositions in combination with actual situations. The present invention will not make any special definitions.

The present invention further provides a prepreg comprising the resin composition prepared according to the process stated in the first aspect, or the resin composition stated in the second aspect, as well as a reinforcing material. The reinforcing material is not specifically defined, and it may be organic fibers, inorganic fiber woven fabrics, or non-woven fabrics. Said organic fibers may be aramid non-woven fabrics; said inorganic fiber woven fabrics may be E-glass fiber fabrics, D-glass fiber fabrics, S-glass fiber fabrics, T-glass fiber fabrics, NE-glass fiber fabrics, or quartz cloth. The thickness of the reinforcing material is not specifically defined. In consideration of better size stability of the laminates, the woven and non-woven fabrics have a thickness of preferably 0.01-0.2 mm, and are preferably subjected to fiber opening treatment and surface treatment with a silane coupling agent. In order to provide better water resistance and heat resistance, said silane coupling agent is preferably anyone selected from the group consisting of epoxy silane coupling agent, amino silane coupling agent and vinyl silane coupling agent, or a mixture of at least two selected therefrom. The reinforcing material is impregnated with the aforesaid composite material, baked at 100-250° C. for 1-15 min to obtain said prepregs.

The copper clad laminate for printed circuit board of the present invention comprises a laminate prepared by binding two or more prepregs together by heating and pressing, and metal foils bond to one or both sides of the laminate. The copper clad lamination shall satisfy the following requirements including (1) the temperature rising rate which should be controlled at 1.0-3.0° C./min at the material temperature which is 80-160° C.; (2) the pressure setting of the lamination: applying a full pressure of about 300 psi when the outer material temperature is 80-100° C.; and (3) controlling the material temperature at 185° C. during the curing and maintaining the temperature for 90 min. Metal foils to be overlapped can also be nickel foils, aluminium foils, SUS foils and the like, and the material is not defined therein.

As compared to the prior art, the present invention at least has the following beneficial effects:

(1) By adding an acidic filler into the resin composition, the present invention greatly promotes the polymerization of benzoxazine and epoxy resins, decreases the curing temperature needed for the polymerization of benzoxazine and epoxy resins, and makes complete reaction of benzoxazine and epoxy resins.

(2) The laminates prepared from the resin composition added with an acidic filler have a high anti-stripping stability, a high glass transition temperature, a low water absorption, a high heat resistance, a high bending strength and a better processability, and can achieve a low coefficient of thermal expansion.

(3) By combining epoxy resins having different structures and epoxy equivalents together, the present invention not only ensures that the resin composition has a higher glass transition temperature, a better mechanical performance and a lower water absorption, and further improves the worse machinability of the resin composition.

(4) The selection of epoxy resins and the addition of the acidic filler could have mutual synergistic effects, so as to be helpful to achieving stronger peeling strength and increasing the reliability of the resin composition.

EMBODIMENTS

The technical solutions of the present invention are further explained by the following embodiments.

The following refers to the specific embodiments of the present invention. It should be pointed out that, without departing from the principles of the examples of the present invention, a number of amendments and improvements can also be made for those ordinarily skilled in the art. Moreover, such amendments and improvements are also deemed as the protection scopes of the examples of the present invention.

The examples of the present invention are further stated below. The examples of the present invention are not limited to the following specific examples, and could be properly amended and carried out without changing the scopes of the claims.

Unless otherwise stated hereinafter, said "parts" refers to "weight parts", and said "%" refers to "weight %".

The materials and brands involved in the examples and comparison examples are provided as follows.

(A) Epoxy Resin
A1: Biphenyl epoxy resin purchased from Nippon Kayaku, having the model of NC-3000H and having an epoxy equivalent of 288;
A2: phenolic epoxy resin purchased from Nippon Kayaku, having the model of EPPN-501H and having an epoxy equivalent of 166;
A3: Bisphenol F type epoxy resin purchased from Shanghai Shiyue, having the model of KF21 and having an epoxy equivalent of 540;
A4: Bisphenol A type epoxy resin purchased from Changchun Resin, having the model of BE504ELM65 and having an epoxy equivalent of 890;
A5: Epoxy resin purchased from NIPPON STEEL CHEMICAL, having the model of YDF-2004 and having an epoxy equivalent of 1005;
(B) Benzoxazine Resin
B1: a product having the model of LZ8290H62 and purchased from Huntsman;
B2: a product having the model of D125 and purchased from EM Technology;
(C) Flame Retardant
C1: a product having the model of SPB-100 and purchased from Otsuka Chemical;
C2: a product having the model of PX-200 and purchased from Daihachi Chemical;
(D) Filler
D1: Spherical silica DQ-1030 having a pH=4.0 and purchased from Novoray;
D2: Spherical silica DQ-1028L having a pH=5.8 and purchased from Novoray;
D3: Air flow quartz powder purchased from Wuzhou Yingfeng Mining, having the model of 3000 meshes and having a pH of 3.0;
D4: mica powder GD-2 having a pH=5.0 and purchased from Gerui;
D5: carbon black having a pH=3.0 and purchased from Tianjin Xinglongtai Chemical Products Technology Co., Ltd;
D6: boehmite BG-615 having a pH=6.8 and purchased from Bengbu Xinyuan;
D7: Silica MEGASIL525 having a pH=6.5 and purchased from Sibelco;
D8: Spherical silica power SC2500-SEJ having a pH pH=8.0 and purchased from Admatechs; and
(E) Curing Accelerator
E1: 2-Phenylimidazole Purchased from Shikoku Chemicals.

The resin compositions provided in the examples and comparison examples were used to prepare laminates for printed circuit according to the following method, and the performance test was carried out for the prepared laminates.

The laminates for printed circuit are prepared by
① binding one or more prepregs together by heating and pressing to prepare a laminate;
② binding metal foils to one or both sides of the laminate prepared in step ①;
③ laminating in a laminator;
overlapping 8 sheets of prepregs and 2 sheets of metal foils in an amount of one ounce (having a thickness of 35 μm) during the step ②;
during the step ③, laminating at 80-140° C. which is the material temperature, a temperature rising rate of 1.5-2.5° C./min, applying a full pressure of about 350 psi when the outer material temperature is 80-100° C.; controlling the material temperature at 195° C. and maintaining the temperature for at least 60 min.

The formulations and performance test results of the resin compositions provided in the examples and comparison examples are stated in Tables 1-4.

TABLE 1

|  | Example 1 | Example 2 | Example 3 | Example 4 | Example 5 | Example 6 | Example 7 | Example 8 | Example 9 |
|---|---|---|---|---|---|---|---|---|---|
| A1 | 8 | 24 | 6 | 45 | 45 | 70 | 25 | 25 | 10 |
| A2 |  |  |  |  |  |  |  |  |  |
| A3 | 2 | 6 | 24 | 5 | 5 | 10 | 25 | 25 | 70 |
| A4 |  |  |  |  |  |  |  |  |  |
| A5 |  |  |  |  |  |  |  |  |  |
| B1 | 80 | 50 | 50 | 30 | 30 | 80 | 80 | 80 | 80 |
| B2 |  |  |  |  |  |  |  |  |  |
| C1 | 10 | 20 | 20 | 20 | 0 | 30 | 10 | 10 | 30 |
| C2 |  |  |  |  | 20 |  |  |  |  |
| D1 | 30 | 10 | 5 | 30 | 5 | 60 | 2 | 65 | 60 |
| D2 |  |  |  |  |  |  |  |  |  |
| D3 |  |  |  |  |  |  |  |  |  |
| D4 |  |  |  |  |  |  |  |  |  |
| D5 |  |  |  |  |  |  |  |  |  |
| D6 |  |  |  |  |  |  |  |  |  |
| D7 |  |  |  |  |  |  |  |  |  |
| D8 |  |  |  |  |  |  |  |  |  |
| E1 | q.s. | q.s. | q.s. | q.s. | q.s. | q.s. | q.s. | q.s. | q.s. |
| Glue GT | 320 | 270 | 286 | 240 | 272 | 230 | 348 | 204 | 224 |
| Resin DSC starting temperature | 122 | 119 | 120 | 116 | 114 | 114 | 132 | 112 | 114 |
| Resin DSC peak temperature | 210 | 212 | 214 | 208 | 210 | 202 | 228 | 204 | 216 |
| Glass transition temperature (Tg, ° C.) | 185 | 178 | 171 | 170 | 159 | 167 | 160 | 173 | 152 |
| Flame retardancy (1.60 mm) | V-0 | V-0 | V-0 | V-0 | V-0 | V-0 | V-0 | V-0 | V-0 |
| Dip soldering-resistant time | >5 min | >5 min | >5 min | >5 min | >5 min | >5 min | <5 min | <5 min | <5 min |

TABLE 1-continued

|  | Example 1 | Example 2 | Example 3 | Example 4 | Example 5 | Example 6 | Example 7 | Example 8 | Example 9 |
|---|---|---|---|---|---|---|---|---|---|
| Water absorption (%) | 0.08 | 0.1 | 0.1 | 0.12 | 0.12 | 0.06 | 0.11 | 0.07 | 0.14 |
| Peeling strength (N/mm) | 1.10-1.25 | 1.20-1.35 | 1.05-1.35 | 1.20-1.40 | 1.10-1.20 | 0.90-1.15 | 1.15-1.30 | 0.95-1.20 | 1.10-1.30 |
| CTE (%) | 2 | 2.3 | 2.5 | 2.5 | 2.5 | 2.2 | 2.5 | 2.2 | 2.6 |

TABLE 2

|  | Example 10 | Example 11 | Example 12 | Example 13 | Example 14 | Example 15 | Example 16 | Example 17 | Example 18 | Example 19 |
|---|---|---|---|---|---|---|---|---|---|---|
| A1 | 45 | 45 | 45 | 45 |  |  | 45 | 45 | 25 | 25 |
| A2 |  |  |  |  | 45 | 45 |  |  |  |  |
| A3 | 5 | 5 | 5 | 5 | 5 |  |  |  | 25 | 25 |
| A4 |  |  |  |  |  | 5 | 5 | 5 | 5 |  |
| A5 |  |  |  |  |  |  |  | 5 |  |  |
| B1 | 30 | 30 | 30 | 30 | 30 | 30 | 30 | 30 | 80 | 80 |
| B2 |  |  |  |  |  |  |  |  |  |  |
| C1 | 20 | 20 | 20 | 20 | 20 | 20 | 20 | 20 | 10 | 10 |
| C2 |  |  |  |  |  |  |  |  |  |  |
| D1 |  |  |  |  | 30 | 30 | 30 | 30 | 30 | 45 |
| D2 | 30 |  |  |  |  |  |  |  |  |  |
| D3 |  | 30 |  |  |  |  |  |  |  |  |
| D4 |  |  | 30 |  |  |  |  |  |  | 20 |
| D5 |  |  |  | 30 |  |  |  |  |  |  |
| D6 |  |  |  |  |  |  |  |  |  |  |
| D7 |  |  |  |  |  |  |  |  | 35 |  |
| D8 |  |  |  |  |  |  |  |  |  |  |
| E1 | q.s. | q.s. | q.s. | q.s. | q.s. | q.s. | q.s. | q.s. | q.s. | q.s. |
| Glue GT | 241 | 238 | 240 | 242 | 207 | 210 | 235 | 248 | 281 | 268 |
| Resin DSC starting temperature | 117 | 116 | 117 | 117 | 112 | 117 | 116 | 119 | 115 | 114 |
| Resin DSC peak temperature | 209 | 208 | 207 | 209 | 210 | 209 | 208 | 212 | 212 | 208 |
| Glass transition temperature (Tg, ° C.) | 170 | 170 | 170 | 170 | 188 | 186 | 170 | 168 | 168 | 175 |
| Flame retardancy (1.60 mm) | V-0 | V-0 | V-0 | V-0 | V-0 | V-0 | V-0 | V-0 | V-0 | V-0 |
| Dip soldering-resistant time | >5 min | >5 min | >5 min | >5 min | >5 min | >5 min | >5 min | >5 min | >5 min | >5 min |
| Water absorption (%) | 0.12 | 0.12 | 0.12 | 0.12 | 0.13 | 0.13 | 0.12 | 0.12 | 0.08 | 0.07 |
| Peeling strength (N/mm) | 1.20-1.40 | 1.20-1.40 | 1.20-1.40 | 1.20-1.40 | 1.20-1.45 | 1.20-1.45 | 1.20-1.40 | 1.25-1.45 | 0.85-1.10 | 0.85-1.10 |
| CTE (%) | 2.5 | 2.5 | 2.5 | 2.5 | 2.2 | 2.2 | 2.5 | 2.5 | 2.1 | 2.1 |

TABLE 3

|  | Comparison Example 1 | Comparison Example 2 | Comparison Example 3 | Comparison Example 4 | Comparison Example 5 | Comparison Example 6 |
|---|---|---|---|---|---|---|
| A1 | 8 | 24 | 24 | 24 | 25 |  |
| A2 |  |  |  |  | 25 |  |
| A3 | 2 | 6 | 6 | 6 |  | 25 |
| A4 |  |  |  |  |  | 25 |
| A5 |  |  |  |  |  |  |
| B1 | 80 | 50 | 50 | 50 | 30 | 30 |
| B2 |  |  |  |  |  |  |
| C1 | 10 | 20 | 20 | 20 | 20 | 20 |
| C2 |  |  |  |  |  |  |
| D1 | 0 |  |  |  | 30 | 30 |
| D2 |  |  |  |  |  |  |
| D3 |  |  |  |  |  |  |
| D4 |  |  |  |  |  |  |
| D5 |  |  |  |  |  |  |
| D6 |  | 10 |  |  |  |  |
| D7 |  |  | 10 |  | 10 |  |
| D8 |  |  |  | 10 |  |  |
| E1 | q.s. | q.s. | q.s. | q.s. | q.s. | q.s. |
| Glue GT | 347 | 296 | 298 | 298 | 218 | 240 |
| Resin DSC starting temperature | 138 | 128 | 127 | 127 | 114 | 119 |

TABLE 3-continued

|  | Comparison Example 1 | Comparison Example 2 | Comparison Example 3 | Comparison Example 4 | Comparison Example 5 | Comparison Example 6 |
|---|---|---|---|---|---|---|
| Resin DSC peak temperature | 226 | 223 | 221 | 221 | 210 | 232 |
| Glass transition temperature (Tg, ° C.) | 178 | 168 | 171 | 172 | 185 | 153 |
| Flame retardancy (1.60 mm) | V-0 | V-0 | V-0 | V-0 | V-0 | V-0 |
| Dip soldering-resistant time | <5 min | <5 min | <5 min | <5 min | <5 min | <5 min |
| Water absorption (%) | 0.1 | 0.1 | 0.1 | 0.1 | 0.1 | 0.15 |
| Peeling strength (N/mm) | 0.95-1.15 | 1.00-1.15 | 0.85-1.05 | 0.85-1.05 | 1.20-1.40 | 1.10-1.30 |
| CTE (%) | 2.3 | 2.3 | 2.3 | 2.3 | 2.1 | 2.6 |

TABLE 4

|  | Comparison Example 7 | Comparison Example 8 | Comparison Example 9 | Comparison Example 10 | Comparison Example 11 | Comparison Example 12 | Comparison Example 13 |
|---|---|---|---|---|---|---|---|
| A1 | 24 | 30 | 0 |  |  | 25 |  |
| A2 |  |  |  | 30 |  |  |  |
| A3 | 6 | 0 | 30 |  |  |  | 25 |
| A4 |  |  |  |  |  |  |  |
| A5 |  |  |  |  | 50 | 25 | 25 |
| B1 | 50 | 50 | 50 | 50 | 80 | 80 | 80 |
| B2 |  |  |  |  |  |  |  |
| C1 | 20 | 20 | 20 | 20 | 10 | 10 | 10 |
| C2 |  |  |  |  |  |  |  |
| D1 | 0 | 10 | 10 | 10 | 65 | 65 | 65 |
| D2 |  |  |  |  |  |  |  |
| D3 |  |  |  |  |  |  |  |
| D4 |  |  |  |  |  |  |  |
| D5 |  |  |  |  |  |  |  |
| D6 |  |  |  |  |  |  |  |
| D7 |  |  |  |  | 10 |  |  |
| D8 |  |  |  |  |  |  |  |
| E1 | q.s. | q.s. | q.s. | q.s. | q.s. | q.s. | q.s. |
| Glue GT | 290 | 262 | 299 | 223 | 331 | 302 | 328 |
| Resin DSC starting temperature | 125 | 117 | 122 | 112 | 138 | 129 | 135 |
| Resin DSC peak temperature | 218 | 209 | 216 | 212 | 237 | 221 | 235 |
| Glass transition temperature (Tg, ° C.) | 173 | 183 | 153 | 192 | 142 | 162 | 149 |
| Flame retardancy (1.60 mm) | V-0 | V-0 | V-1 | V-0 | V-1 | V-0 | V-1 |
| Dip soldering-resistant time | <5 min | >5 min | <5 min | <5 min | <5 min | >5 min | <5 min |
| Water absorption (%) | 0.12 | 0.09 | 0.14 | 0.09 | 0.15 | 0.12 | 0.14 |
| Peeling strength (N/mm) | 0.90-1.15 | 1.00-1.20 | 0.90-1.15 | 1.10-1.55 | 0.75-1.35 | 1.05-1.30 | 0.75-1.35 |
| CTE (%) | 2.5 | 2.3 | 2.8 | 2.1 | 2.6 | 2.4 | 2.6 |

The items and specific methods of the performance test are as follows.
  (a) Glass transition temperature (Tg): tested according to the DSC method as stipulated under IPC-TM-650 2.4.25 in accordance with Differential Scanning calorimetry;
  (b) Flame retardancy: tested according to the UL-94 standard;
  (c) Water absorption: tested according to the method as stipulated under IPC-TM-650 2.6.2.1;
  (d) Glue GT: tested at a temperature of 174° C.;
  (e) Resin DSC reaction curve test: instrument manufacturer: TA, US; having a temperature rising rate of 10° C./min under N2 environment;
  (f) Peeling strength: tested according to the method as stipulated under IPC-TM-650 2.4.8
  (g) Coefficient of Thermal expansion: tested according to the method IPC-TM-650 2.4.24.

The followings are the physical property analysises.
  (1) According to Tables 1-4, it can be seen by comparing Example 1 with Comparison Example 1 that the addition of the acidic filler in Example 1 could make the resin DSC starting temperature and peak temperature lower as compared to no addition of any acidic filler in Comparison Example 1. The prepared boards had a higher glass transition temperature, a longer dip-soldering resistant time, a lower water absorption and a higher peeling strength.

By comparing Example 2 with Comparison Examples 2-4, it can be seen that the addition of the acidic filler having a pH of 4.0 in Example 2 could make the resin DSC starting temperature and peak temperature lower as compared to the addition of the acidic filler having a pH of higher than 6.0 in Comparison Examples 2-3 and the addition of non-acidic filler in Comparison Example 4. The prepared boards had a higher glass transition temperature, a longer dip-soldering resistant time, and a higher peeling strength.

By comparing Example 2 with Comparison Example 7, it can be seen that the addition of the acidic filler in Example 2 could make the resin DSC starting temperature and peak temperature lower as compared to no addition of any acidic filler in Comparison Example 7. The prepared boards had a higher glass transition temperature, a longer dip-soldering resistant time, a lower water absorption and a higher peeling strength.

According to Examples 1-2 and Comparison Examples 1-4 and 7, it can be seen that the addition of the acidic filler having a pH of 2-6 in the present invention could make the resin DSC starting temperature and peak temperature lower and make the boards have more excellent performances as compared to the fillers within other pH ranges.

(2) According to Tables 1-4, it can be seen by comparing Example 2 with Comparison Examples 8-10 that the additions of an epoxy resin having an epoxy equivalent of 150-450 and an epoxy resin having an epoxy equivalent of 451-1000 in Example 2 could make lower water absorption and more excellent peeling strength than the addition of only an epoxy resin having an epoxy equivalent of 150-450 in Comparison Examples 8 and 10, and lower resin DSC starting temperature and peak temperature than the addition of only an epoxy resin having an epoxy equivalent of 451-1000 in Comparison Example 9. The prepared boards had a higher glass transition temperature, a flame retardancy of the V-0 level, a longer dip-soldering resistant time, a lower water absorption and more excellent peeling strength.

By comparing Example 4 with Comparison Examples 5-6, it can be seen that the addition of an epoxy resin having an epoxy equivalent of 150-450 and an epoxy resin having an epoxy equivalent of 451-1000 in Example 4 could make more excellent dip-soldering resistance, lower water absorption and higher peeling strength than the addition of two epoxy resins having an epoxy equivalent of 150-450 in Comparison Example 5, and lower resin DSC starting temperature and peak temperature than the addition of two epoxy resins having an epoxy equivalent of 451-1000 in Comparison Example 6. The prepared boards had a higher glass transition temperature, a longer dip-soldering resistant time, a lower water absorption and more excellent peeling strength.

By comparing Example 8 with Comparison Examples 11-13, it can be seen that the addition of an epoxy resin having an epoxy equivalent of 150-450 and an epoxy resin having an epoxy equivalent of 451-1000 in Example 8 could make lower resin DSC starting temperature and peak temperature than the addition of an epoxy resin having an epoxy equivalent of greater than 1000 in Comparison Example 11. The prepared boards had a higher glass transition temperature and a lower water absorption. The addition in Example 8 could make lower resin DSC starting temperature and peak temperature, a higher glass transition temperature and a lower water absorption than the addition of an epoxy resin having an epoxy equivalent of 150-450 and an epoxy resin having an epoxy equivalent of greater than 1000 in Comparison Example 12, and the addition of an epoxy resin having an epoxy equivalent of 451-1000 and an epoxy resin having an epoxy equivalent of greater than 1000 in Comparison Example 13.

According to Examples 2, 4 and 8, and Comparison Examples 5-6 and 8-13, it can be seen that the present invention discloses the addition of an epoxy resin having an epoxy equivalent of 150-450 and an epoxy resin having an epoxy equivalent of 451-1000. Said two epoxy resins have synergistic effects, and their combined action makes the boards have more excellent performances.

(3) By comparing Examples 1 and 3 with Examples 6 and 9, it can be seen that, when the weight ratio of the epoxy resins having an epoxy equivalent of 150-450 and having an epoxy equivalent of 451-1000 in Examples 1 and 3 was controlled with the range of 4:1-1:4, the prepared boards had a higher glass transition temperature, as compared to those beyond said range in Examples 6 and 9.

It can be seen from the examples above that, by adding an acidic filler into the resin composition, the present invention greatly promotes the polymerization of benzoxazine and epoxy resins, decreases the curing temperature needed for the polymerization of benzoxazine and epoxy resins, and makes complete reaction of benzoxazine and epoxy resins. The laminates prepared from the resin composition added with an acidic filler have a high anti-stripping stability, a high glass transition temperature, a low water absorption, a high heat resistance, a high bending strength and a better processability, and can achieve a low coefficient of thermal expansion. Meanwhile, by combining epoxy resins having different structures and epoxy equivalents together, the present invention improves the worse machinability of the resin composition, while ensuring that the resin composition has a higher glass transition temperature, a better mechanical performance and a lower water absorption. The selection of epoxy resins, and the addition of acidic filler will produce synergistic effects with each other, which is conducive to realizing more stable peeling strength and increasing the reliability of the resin composition.

It shall be noticed and understood that various amendments and improvements can be made to the present invention detailedly stated above, without departing from the spirit and scope of the present invention as set forth in the appended claims. Thus the scope of the claimed technical solution is not limited by any specific demonstration teaching provided therein.

The applicant claims that the present invention describes the detailed process of the present invention, but the present invention is not limited to the detailed process of the present invention. That is to say, it does not means that the present invention shall be carried out with respect to the above-described detailed process of the present invention. Those skilled in the art shall know that any improvements to the present invention, equivalent replacements of the raw materials of the present invention, additions of auxiliary components, selections of any specific ways all fall within the protection scope and disclosure scope of the present invention.

The invention claimed is:

1. A process for preparing a resin composition comprising benzoxazine wherein an acidic filler having a pH of 5-6 is added into the resin composition comprising benzoxazine,
    wherein the resin composition comprising benzoxazine comprises a benzoxazine resin and epoxy resins comprising an epoxy resin A1 having an epoxy equivalent of 150-450 and an epoxy resin A2 having an epoxy equivalent of 451-1000.

2. The process claimed in claim 1, wherein the acidic filler is added in an amount of 0.05-100 parts by weight, based on 100 parts by weight of organic solids in the resin composition comprising benzoxazine.

3. The process claimed in claim 1, wherein the resin composition comprising benzoxazine comprises the following components, based on 100 parts by weight of organic solids:
    (A) from 5 to 80 parts by weight of epoxy resins;
    (B) from 10 to 80 parts by weight of the benzoxazine resin; and (C) from 1 to 30 parts by weight of a flame retardant,
wherein epoxy resins A1 and A2 in the epoxy resins have a weight ratio of 10:1-1:10.

4. The process claimed in claim 3, wherein the epoxy resin A1 is anyone selected from the group consisting of a biphenyl epoxy resin, a dicyclopentadiene epoxy resin, a phenolic epoxy resin, a naphthalene-containing epoxy resin, an anthracene-containing epoxy resin, and a mixture of at least two selected therefrom, and has an epoxy equivalent of 150-450.

5. The process claimed in claim 3, wherein the benzoxazine resin is anyone selected from the group consisting of a bisphenol A benzoxazine resin, a dicyclopentadiene benzoxazine resin, a bisphenol F benzoxazine resin, a phenolphthalein benzoxazine resin, an MDA (4,4'-diaminodiphenylmethane) benzoxazine resin, and a mixture of at least two selected therefrom.

6. The process claimed in claim 3, wherein the flame retardant is anyone selected from the group consisting of a resorcinol-bis(diphenyl phosphate), a bisphenol A-bis(diphenyl phosphate), resorcinol-bis(2,6-dimethylphenyl phosphate), a dimethyl methyl phosphonate, a phosphazene compounds, and a mixture of at least two selected therefrom.

7. The process claimed in claim 3, wherein the resin composition comprising benzoxazine further comprises an epoxy resin having an epoxy equivalent of greater than 1000.

8. A resin composition comprising benzoxazine prepared by the process claimed in claim 1, wherein the resin composition comprising benzoxazine comprises epoxy resins, a benzoxazine resin and an acidic filler,
wherein the acidic filler has a pH of 5-6, and
wherein the epoxy resin comprises an epoxy resin A1 having an epoxy equivalent of 150-450, and an epoxy resin A2 having an epoxy equivalent of 451-1000.

9. A prepreg comprising the resin composition prepared by the process claimed in claim 1, or the resin composition according to claim 8.

10. A laminate or printed circuit board comprising at least one sheet of the prepreg claimed in claim 9.

11. The process claimed in claim 1, wherein the acidic filler is anyone selected from the group consisting of a silica power, a quartz powder, a mica powder, a clay, a calcium oxalate, a carbon black, and a mixture of at least two selected therefrom.

12. The process claimed in claim 1, wherein the acidic filler has a particle size of 50 nm-50 μm.

13. The process claimed in claim 3 wherein the epoxy resin A2 is anyone selected from the group consisting of a bisphenol A epoxy resin, a bisphenol F epoxy resin, a carboxylated nitrile-butadiene rubber modified epoxy resin, an epoxy resin containing oxazolidinone ring, and a mixture of at least two selected therefrom, and has an epoxy equivalent of 451-1000.

14. The process claimed in claim 3, wherein the resin composition comprising benzoxazine further comprises a non-acidic filler.

15. The process claimed in claim 14, wherein the non-acidic filler is anyone selected from the group consisting of a calcium carbonate, a calcium sulfate, an alumina, a barium sulfate, a ceramic powder, a talc powder, an hydrotalcite, and a mixture of at least two selected therefrom.

16. The process claimed in claim 14, wherein the non-acidic filler is added in an amount of 0-100 parts by weight, based on 100 parts by weight of organic solids.

17. The process claimed in claim 3, wherein the resin composition comprising benzoxazine further comprises (D) a curing accelerator.

18. The process claimed in claim 17, wherein the curing accelerator is added in an amount of 0.1-1 part by weight, based on 100 parts by weight of organic solids.

19. The process claimed in claim 17, wherein the curing accelerator is anyone selected from the group consisting of an imidazole accelerators and their derivatives, a pyridine accelerators, a Lewis acid accelerators, and a mixture of at least two selected therefrom.

\* \* \* \* \*